(12) United States Patent
Qian et al.

(10) Patent No.: US 12,131,698 B2
(45) Date of Patent: Oct. 29, 2024

(54) PIXEL DRIVING CIRCUIT AND MANUFACTURING METHOD THEREOF, DISPLAY PANEL, AND DISPLAY APPARATUS

(71) Applicant: BOE TECHNOLOGY GROUP CO., LTD., Beijing (CN)

(72) Inventors: Yuhan Qian, Beijing (CN); Libin Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 433 days.

(21) Appl. No.: 17/638,720

(22) PCT Filed: Feb. 18, 2021

(86) PCT No.: PCT/CN2021/076696
§ 371 (c)(1),
(2) Date: Feb. 25, 2022

(87) PCT Pub. No.: WO2021/164699
PCT Pub. Date: Aug. 26, 2021

(65) Prior Publication Data
US 2023/0028377 A1    Jan. 26, 2023

(30) Foreign Application Priority Data
Feb. 18, 2020   (CN) .......................... 202010100107.9

(51) Int. Cl.
*H01L 27/14* (2006.01)
*G09G 3/3233* (2016.01)
(Continued)

(52) U.S. Cl.
CPC ......... *G09G 3/3233* (2013.01); *H10K 59/131* (2023.02); *H10K 71/00* (2023.02);
(Continued)

(58) Field of Classification Search
CPC ......... G09G 3/3233; G09G 2300/0426; G09G 2300/0819; G09G 2300/0842;
(Continued)

(56) References Cited

U.S. PATENT DOCUMENTS 11,004,384 B2 *  5/2021  Ji .......................... H01L 27/156
2018/0053795 A1   2/2018  Lan
2019/0057648 A1   2/2019  Xu

FOREIGN PATENT DOCUMENTS

CN   106875893 A   6/2017
CN   106886111 A   6/2017
(Continued)

*Primary Examiner* — Tan N Tran
(74) *Attorney, Agent, or Firm* — IP & T GROUP LLP

(57) ABSTRACT

A pixel driving circuit includes a first thin film transistor having a double-gate structure, a conductive layer and a second thin film transistor. The first thin film transistor includes a first active layer. The first active layer includes a first and second semiconductor portions and a conductor portion located therebetween. The conductor portion has a first doping concentration. The conductive layer is at least partially opposite to the conductor portion, so that the conductive layer and the conductor portion form a capacitor. The conductive layer is configured to electrically connect to an initial voltage terminal. The second thin film transistor includes a second active layer and a first gate. A portion of the second active layer directly opposite to the first gate has a second doping concentration, and the second doping concentration is lower than the first doping concentration.

16 Claims, 7 Drawing Sheets

(51) Int. Cl.
  *H10K 59/131* (2023.01)
  *H10K 71/00* (2023.01)
  *H10K 59/12* (2023.01)
(52) U.S. Cl.
  CPC ............... *G09G 2300/0426* (2013.01); *G09G 2300/0819* (2013.01); *G09G 2300/0842* (2013.01); *H10K 59/1201* (2023.02)
(58) Field of Classification Search
  CPC .. H10K 59/131; H10K 71/00; H10K 59/1201; H10K 71/30; H01L 29/78645; H01L 27/1255; H01L 27/1222; H01L 21/77; H01L 27/127
  USPC ...................................................... 257/59, 72
  See application file for complete search history.

(56) References Cited

FOREIGN PATENT DOCUMENTS

| | | |
|---|---|---|
| CN | 109903724 A | 6/2019 |
| JP | 2009-086252 A | 4/2009 |

\* cited by examiner

PIXEL DRIVING CIRCUIT AND MANUFACTURING METHOD THEREOF, DISPLAY PANEL, AND DISPLAY APPARATUS

CROSS-REFERENCE TO RELATED APPLICATIONS

This application is a national phase entry under 35 USC 371 of International Patent Application No. PCT/CN2021/076696, filed on Feb. 18, 2021, which claims priority to Chinese Patent Application No. 202010100107.9, filed on Feb. 18, 2020, which are incorporated herein by reference in their entirety.

TECHNICAL FIELD

The present disclosure relates to the field of display technologies, and in particular, to a pixel driving circuit and a manufacturing method thereof, a display panel and a display apparatus.

BACKGROUND

Organic light-emitting diodes (OLEDs) have attracted much attention due to their advantages of high brightness, full viewing angle, fast response speed, flexible display, etc. Active matrix organic light-emitting diodes (AMOLEDs) are widely used in the display field due to their advantages of low driving voltage and long service life.

SUMMARY

In an aspect, a pixel driving circuit is provided. The pixel driving circuit includes a first thin film transistor having a double-gate structure, a conductive layer disposed on a side of the conductor portion of the first active layer in a thickness direction of the first active layer, and a second thin film transistor electrically connected to the first thin film transistor. The first thin film transistor includes a first active layer. The first active layer includes a first semiconductor portion, a second semiconductor portion, and a conductor portion located between the first semiconductor portion and the second semiconductor portion. The conductor portion has a first doping concentration. The conductive layer is at least partially directly opposite to the conductor portion, so that the conductive layer and the conductor portion form a capacitor. The conductive layer is configured to electrically connect to an initial voltage terminal. The second thin film transistor includes a second active layer and a first gate disposed on a side of the second active layer in a thickness direction of the second active layer. A portion of the second active layer directly opposite to the first gate has a second doping concentration. The second doping concentration is lower than the first doping concentration. The first gate is configured to to electrically connect to an enable signal terminal.

In some embodiments, the first thin film transistor further includes a second gate disposed on the side of the first active layer in the thickness direction of the first active layer. The second gate includes a first sub-gate and a second sub-gate. The first sub-gate is at least partially directly opposite to the first semiconductor portion, and the second sub-gate is at least partially directly opposite to the second semiconductor portion.

In some embodiments, a portion of the first semiconductor portion that is directly opposite to the first sub-gate has the second doping concentration, and a portion of the second semiconductor portion that is directly opposite to the second sub-gate has the second doping concentration.

In some embodiments, the first active layer and the second active layer are disposed in a same layer; and the conductive layer, the first gate, and the second gate are disposed in a same layer.

In some embodiments, the first semiconductor portion extends in a second direction, the second semiconductor portion extends in a first direction, and the first direction intersects the second direction. The conductor portion connects the first semiconductor portion and the second semiconductor portion and extends in the first direction.

In some embodiments, the first semiconductor portion extends in a second direction, the second semiconductor portion extends in a first direction, and the first direction intersects the second direction. The conductor portion connects the first semiconductor portion and the second semiconductor portion and extends in the second direction.

In some embodiments, the pixel driving circuit further includes an interlayer dielectric layer. The interlayer dielectric layer is located between the first active layer and the conductive layer and between the second active layer and the first gate.

In some embodiments, a thickness of a portion of the interlayer dielectric layer located between the first active layer and the conductive layer is in a range of 1100 angstroms to 1300 angstroms, inclusive.

In some embodiments, a second gate of the first thin film transistor is electrically connected to a scan signal terminal, a first electrode of the first thin film transistor is electrically connected to a first node, and a second electrode of the first thin film transistor is electrically connected to a second node. A first electrode of the second thin film transistor is electrically connected to the second node, and a second electrode of the second thin film transistor is electrically connected to a third node. The pixel driving circuit further includes: a third thin film transistor, a fourth thin film transistor, a fifth thin film transistor, a sixth thin film transistor, a seventh thin film transistor, an eighth thin film transistor, a ninth thin film transistor, and a storage capacitor. A gate of the third thin film transistor is electrically connected to the first node, a first electrode of the third thin film transistor is electrically connected to a first voltage signal terminal, and a second electrode of the third thin film transistor is electrically connected to the second node. A gate of the fourth thin film transistor is electrically connected to the scan signal terminal, a first electrode of the fourth thin film transistor is electrically connected to a data signal terminal, and a second electrode of the fourth thin film transistor is electrically connected to a fourth node. A gate of the fifth thin film transistor is electrically connected to the enable signal terminal, and a first electrode of the fifth thin film transistor is electrically connected to the first node. A gate of the sixth thin film transistor is electrically connected to a reset signal terminal, a first electrode of the sixth thin film transistor is electrically connected to the initial voltage terminal, and a second electrode of the sixth thin film transistor is electrically connected to the first node. A gate of the seventh thin film transistor is electrically connected to the reset signal terminal, a first electrode of the seventh thin film transistor is electrically connected to the initial voltage terminal, and a second electrode of the seventh thin film transistor is electrically connected to the third node. A gate of the eighth thin film transistor is electrically connected to the enable signal terminal, a first electrode of the eighth thin film transistor is electrically connected to a reference voltage terminal, and a second electrode of the eighth thin film transistor is electrically connected to the fourth node. A gate of the ninth thin film transistor is electrically connected to the reset signal terminal, a first electrode of the ninth thin film transistor is electrically connected to the reference voltage terminal, and a second electrode of the ninth thin film transistor is electrically connected to the fourth node. A first electrode plate of the storage capacitor is electrically connected to the fourth node, and a second electrode plate of the storage capacitor is electrically connected to the first node.

In some embodiments, the first semiconductor portion, the conductor portion and the second semiconductor portion are sequentially connected to form an integral structure.

In another aspect, a manufacturing method of a pixel driving circuit is provided. The manufacturing method includes: forming a first active pattern and a second active pattern; doping a portion of the first active pattern and a portion of the second active pattern to form a first active layer of a first thin film transistor and a second active layer of a second thin film transistor; the first active layer including a first semiconductor portion, a second semiconductor portion, and a conductor portion located between the first semiconductor portion and the second semiconductor portion; the conductor portion having a first doping concentration; a doped portion of the second active layer having a second doping concentration; the second doping concentration being lower than the first doping concentration; forming a conductive layer on a side of the conductor portion of the first active layer in a thickness direction of the first active layer; the conductive layer being at least partially directly opposite to the conductor portion, so that the conductive layer and the conductor portion form a capacitor; the conductive layer being configured to electrically connect to an initial voltage terminal; and forming a first gate of the second thin film transistor on a side of the second active layer in a thickness direction of the second active layer; the first gate being at least partially directly opposite to the doped portion of the second active layer; and the first gate being configured to electrically connect to an enable signal terminal.

In some embodiments, performing doping on the portion of the first active pattern and the portion of the second active pattern to form the first active layer of the first thin film transistor and the second active layer of the second thin film transistor, includes: performing a first doping on the portion of the first active pattern and the portion of the second active pattern with a first doping parameter, so that the second active pattern forms the second active layer; the portion of the first active pattern that has undergone the first doping and the portion of the second active layer that has undergone the first doping each having a second doping concentration; performing a second doping on the portion of the first active pattern that has undergone the first doping with a second doping parameter, so as to form the conductor portion to obtain the first active layer; the conductor portion that has undergone the first doping and the second doping having the first doping concentration.

In some embodiments, performing the second doping on the portion of the first active pattern that has undergone the first doping with the second doping parameter, so as to form the conductor portion to obtain the first active layer includes: forming a barrier layer on sides of the second active layer and a portion of the first active pattern that has not undergone the first doping; the barrier layer exposing the portion of the first active pattern that has undergone the first doping; and performing the second doping on the portion of the first active pattern that has undergone the first doping with the second doping parameter to form the first active layer.

In some embodiments, after the second doping is performed on the portion of the first active pattern that has undergone the first doping with the second doping parameter, so as to form the conductor portion to obtain the first active layer, the method further includes: removing the barrier layer.

In yet another aspect, a display panel is provided. The display panel includes: a substrate, a plurality of initial voltage signal lines and a plurality of enable signal lines that are disposed on a side of the substrate, and a plurality of pixel driving circuits each as described in any of the above embodiments. The plurality of initial voltage signal lines extends in a second direction, and the plurality of enable signal lines extends in a first direction. A conductive layer of a pixel driving circuit being electrically connected to an initial voltage signal line through an initial voltage terminal, and a first gate of a second thin film transistor of the pixel driving circuit is electrically connected to an enable signal line through an enable signal terminal.

In some embodiments, the display panel further includes a plurality of scan signal lines disposed on the side of the substrate and extending in the first direction. A second gate of a first thin film transistor of the pixel driving circuit is electrically connected to a scan signal line.

In some embodiments, the display panel further includes a plurality of light-emitting devices disposed on the side of the substrate. A second electrode of the second thin film transistor is electrically connected to an anode of a light-emitting device, and a cathode of the light-emitting device is electrically connected to a second voltage signal terminal.

In yet another aspect, a display apparatus is provided. The display apparatus includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, but are not limitations on an actual size of a product, and an actual process of a method involved in the embodiments of the present disclosure.

DETAILED DESCRIPTION

Figure 1:
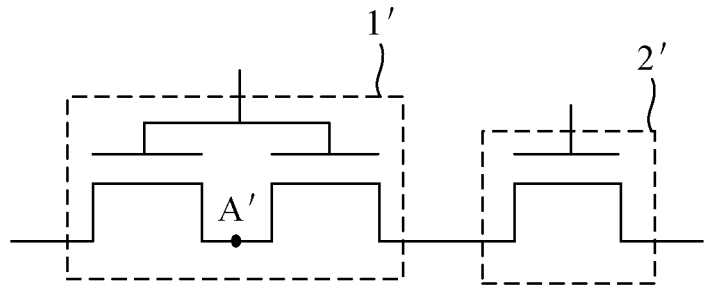
FIG. 1 is a diagram showing structures of a double-gate thin film transistor and a single-gate thin film transistor, in accordance with an implementation.

Technical solutions in some embodiments of the present disclosure will be described clearly and completely below with reference to the accompanying drawings. Obviously, the described embodiments are merely some but not all embodiments of the to present disclosure. All other embodiments obtained based on the embodiments of the present disclosure by a person of ordinary skill in the art shall be included in the protection scope of the present disclosure.

Unless the context requires otherwise, throughout the description and the claims, the term "comprise" and other forms thereof such as the third-person singular form "comprises" and the present participle form "comprising" are construed as an open, inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials, or characteristics may be included in any one or more embodiments or examples in any suitable manner.

Below, the terms "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of", "the plurality of" or "multiple" means two or more unless otherwise specified.

In the description of some embodiments, the term "connected" and its derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other but still cooperate or interact with each other. The embodiments disclosed herein are not necessarily limited to the content herein.

As used herein, the term "if" is optionally construed as "when" or "in a case where" or "in response to determining" or "in response to detecting", depending on the context. Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "applicable to" or "configured to" herein means an open and inclusive language, which does not exclude devices that are applicable to or configured to perform additional tasks or steps.

In addition, the use of the phase "based on" means openness and inclusiveness, since a process, step, calculation or other action that is "based on" one or more of the stated conditions or values may, in practice, be based on additional conditions or values exceeding those stated.

The term such as "about", "substantially" or "approximately" as used herein includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the drawings, thicknesses of layers and sizes of regions are enlarged for clarity. Variations in shape with respect to the drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of regions in an apparatus, and are not intended to limit the scope of the exemplary embodiments.

In thin film transistors employed in circuits provided by the embodiments of the present disclosure, a first electrode of each thin film transistor is one of a source and a drain, and a second electrode of the thin film transistor is the other one of the source and the drain. Since the source and the drain of the thin film transistor may be symmetrical in structure, there may be no difference in structure between the source and the drain of the thin film transistor. That is, the first electrode and the second electrode of the thin film transistor in the embodiments of the present disclosure may be indistinguishable in structure. For example, in a case where the thin film transistor is a P-type transistor, the first electrode of the transistor is the source, and the second electrode of the transistor is the drain. For another example, in a case where the thin film transistor is an N-type transistor, the first electrode of the transistor is the drain, and the second electrode of the transistor is the source.

For the circuits provided by the embodiments of the present disclosure, to descriptions are made by taking an example in which the transistors are all N-type transistors below.

Some thin film transistors in a pixel driving circuit in an active matrix organic light-emitting diode (AMOLED) are transistors having a double-gate structure to improve an operation stability of the pixel driving circuit.

In an implementation, as shown in FIG. 1, the pixel driving circuit includes a double-gate thin film transistor 1' and a single-gate thin film transistor 2' that are electrically connected to each other. The single-gate thin film transistor is electrically connected to an enable signal terminal. In a case where the AMOLED is in a screen-on state, an enable signal transmitted by the enable signal terminal is at a high level, which will cause a threshold voltage of the single-gate thin film transistor 2' to drift (e.g., a drift value of the threshold voltage may be up to 0.5 V). In addition, in a case where the enable signal is at the high level, a voltage at a node A' in the double-gate thin film transistor 1' will jump. Moreover, after voltages at both terminals of the double-gate thin film transistor 1' jump, the voltage at the node A' will jump accordingly, and after the voltages at two terminals of the double-gate thin film transistor 1' recover, the node A' is in a floating state. In this case, the voltage at the node A' may result in leakage current at two terminals of the double-gate thin film transistor 1', which affects the operation reliability of the pixel driving circuit, and easily leads to abnormal display of the AMOLED.

Figure 2:
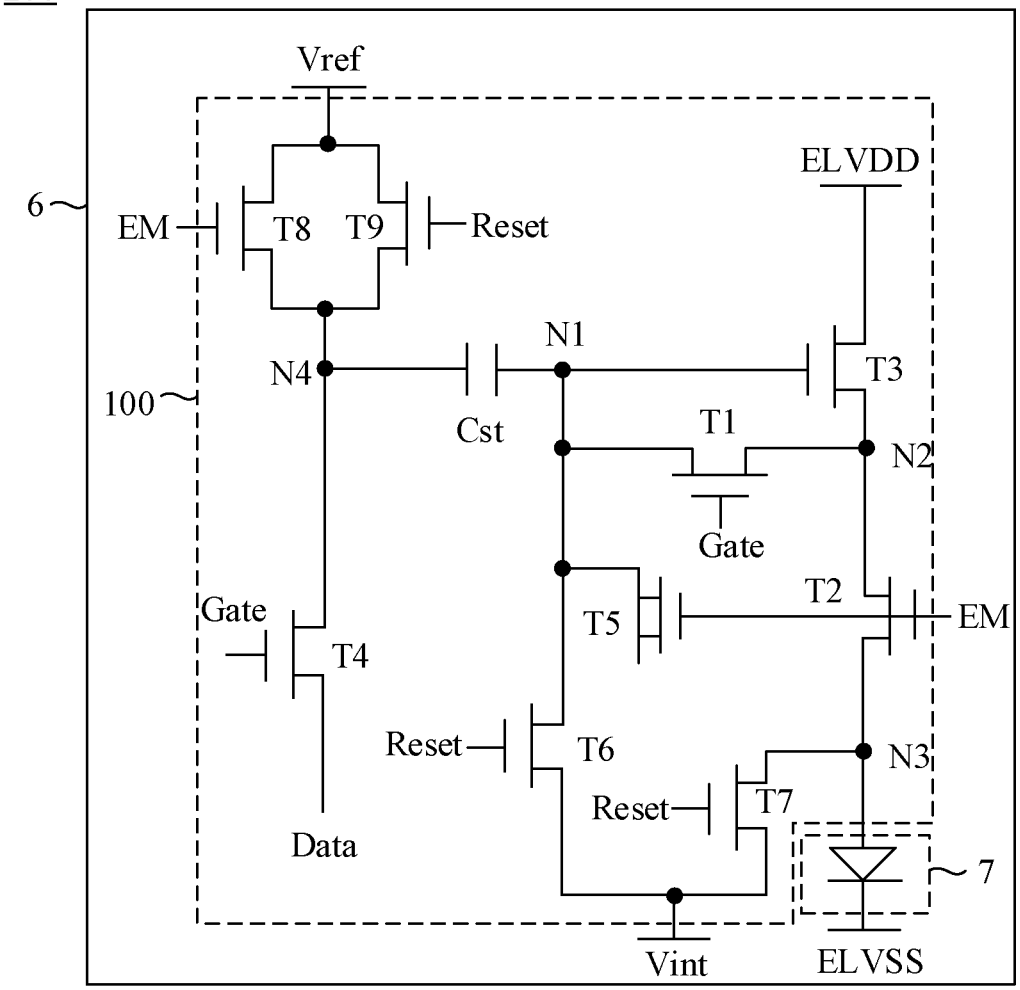
FIG. 2 is a schematic diagram of a display panel, in accordance with some embodiments of the present disclosure.
Figure 3:
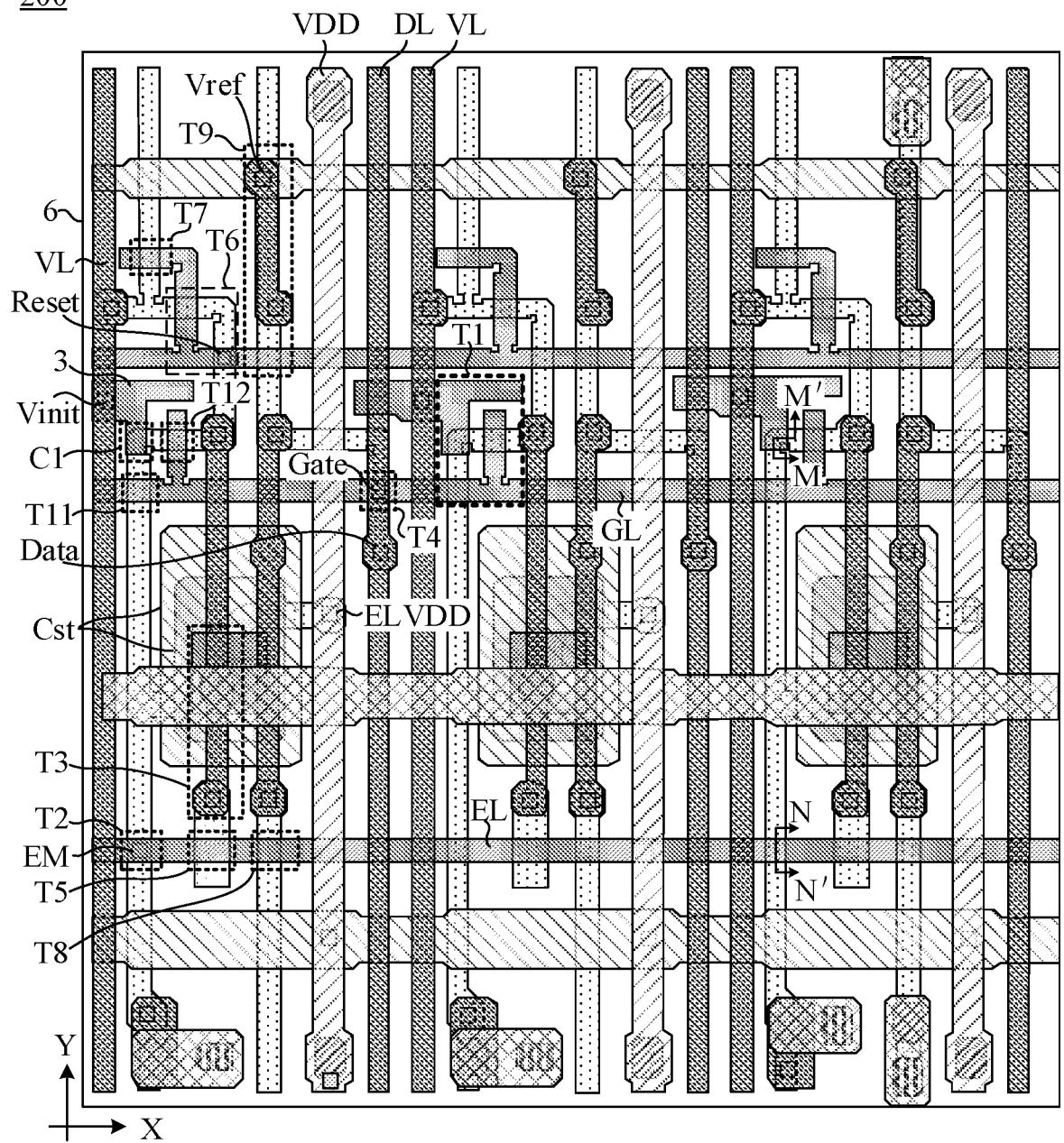
FIG. 3 is a diagram showing a structure of another display panel, in accordance with some embodiments of the present disclosure.

Based on this, as shown in FIGS. 2 and 3, some embodiments of the present disclosure provide a pixel driving circuit 100. The pixel driving circuit 100 includes a first thin film transistor T1, a conductive layer 3, and a second thin film transistor T2 electrically connected to the first thin film transistor T1.

Figure 6:
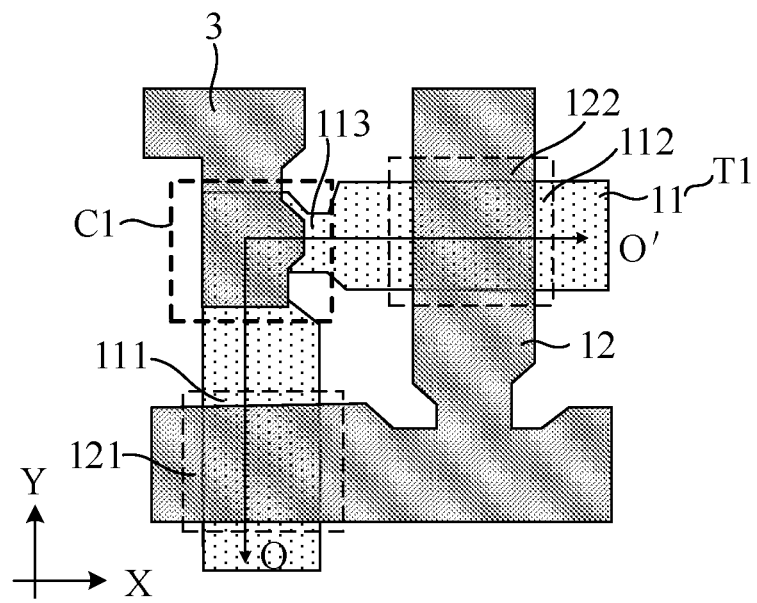
FIG. 6 is a partially schematic diagram of a first thin film transistor and a capacitor in a pixel driving circuit in the display panel shown in FIG. 3.
Figure 7:
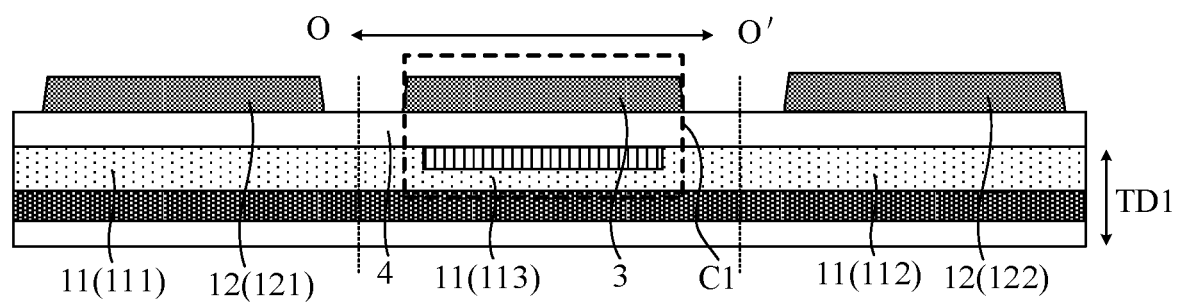
FIG. 7 is a sectional view of a structure shown in FIG. 6 taken along the O-O' direction.

In some examples, as shown in FIGS. 3, 6, and 7, the first thin film transistor T1 includes a first active layer 11. The first active layer 11 includes a first semiconductor portion 111, a second semiconductor portion 112, and a conductor portion 113 located between the first semiconductor portion 111 and the second semiconductor portion 112. The conductor portion 113 is connected to the first semiconductor portion 111 and the second semiconductor portion 112. The conductor portion 113 has a first doping concentration.

For example, the first semiconductor portion 111, the conductor portion 113 and the second semiconductor portion 112 are sequentially connected to form an integral structure. By doping a portion of the first active layer 11 located between the first semiconductor portion 111 and the second semiconductor portion 112 with ions, the portion has the first doping concentration, which may make the portion form a conductor (i.e., the conductor portion 113).

In some examples, the first thin film transistor T1 is a transistor having a double-gate structure. As shown in FIGS. 6 and 7, the first thin film transistor T1 further includes a second gate 12 disposed on a side of the first active layer 11 in a thickness direction TD1 of the first active layer 11.

For example, as shown in FIGS. 6 and 7, the second gate 12 includes a first sub-gate 121 and a second sub-gate 122. The first sub-gate 121 is at least partially directly opposite to the first semiconductor portion 111, and the second sub-gate 122 is at least partially directly opposite to the second semiconductor portion 112.

For example, the description that the first sub-gate 121 is at least partially directly opposite to the first semiconductor portion 111 may mean that a portion of the first sub-gate 121 is directly opposite to a portion of the first semiconductor portion 111, or a portion of the first sub-gate121 is directly opposite to the first semiconductor portion 111, or the first sub-gate 121 is directly opposite to a portion of the first semiconductor portion 111, or the first sub-gate 121 is directly opposite to the first semiconductor portion 111. The description that the second sub-gate 122 is at least partially directly opposite to the second semiconductor portion 112 may mean that a portion of the second sub-gate 122 is directly opposite to a portion of the second semiconductor portion 112, or a portion of the second sub-gate 122 is directly opposite to the second semiconductor portion 112, or the second sub-gate 122 is directly opposite to a portion of the second semiconductor portion 112, or the second sub-gate 122 is directly opposite to the second semiconductor portion 112.

The "directly opposite" mentioned herein means that a structure A is opposite to a structure B, and orthogonal projections of the structure A and the structure B on a plane parallel to a plane where the structure A is located and a plane where the structure B is located have the same shape, area and size.

Figure 5:
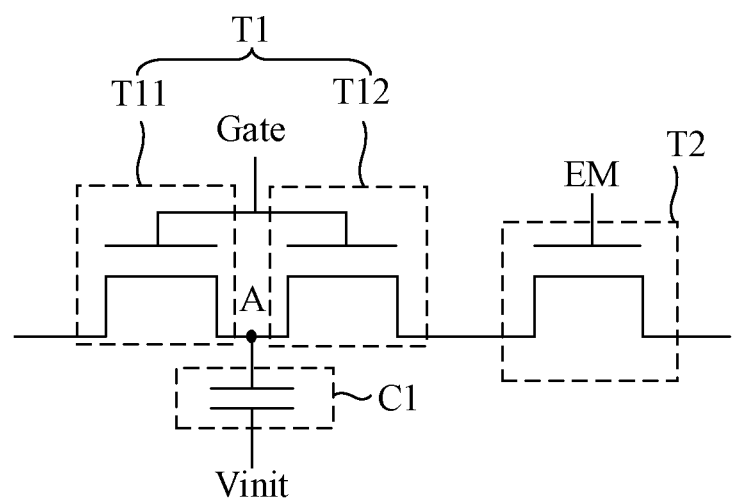
FIG. 5 is an equivalent circuit diagram of a first thin film transistor, a second thin film transistor, and a capacitor in a pixel driving circuit in the display panel shown in FIG. 3.

As shown in FIG. 5, the first thin film transistor T1 may be equivalent to a first sub-transistor T11 and a second sub-transistor T12. A node A represents a node having the same potential as the conductor portion 113.

In some examples, as shown in FIGS. 3, 6, and 7, the conductive layer 3 is disposed on a side of the conductor portion 113 of the first active layer 11 in the thickness direction TD of the first active layer 11, and is at least partially directly opposite to the conductor portion 113, so that the conductive layer 3 and the conductor portion 113 form a capacitor C1. The conductive layer 3 is electrically connected to an initial voltage terminal Vint (as shown in FIG. 5).

For example, the description that the conductive layer 3 is at least partially directly opposite to the conductor portion 113 may mean that a portion of the conductive layer 3 is directly opposite to a portion of the conductor portion 113, or a portion of the conductive layer 3 is directly opposite to the conductor portion 113, or the conductive layer 3 is directly opposite to a portion of the conductor portion 113, or the conductive layer 3 is directly opposite to the conductor portion 113.

For example, in a case where the portion of the conductive layer 3 is directly opposite to the portion of the conductor portion 113, or the portion of the conductive layer 3 is directly opposite to the conductor portion 113, the conductive layer 3 may be electrically connected to the initial voltage terminal Vint through a portion thereof not directly opposite to the conductor portion 113.

Here, as shown in FIG. 7, the conductor portion 113 is located between the first semiconductor portion 111 and the second semiconductor portion 112, and the conductive layer 3 is at least partially directly opposite to the conductor portion 113, which means that the conductive layer 3 is actually located between the first sub-gate 121 and the second sub-gate 122.

For example, an initial voltage signal transmitted by the initial voltage terminal Vint is a constant voltage signal. In a case where the conductive layer 3 and the conductive portion 113 form the capacitor C1, since the initial voltage signal received by the conductive layer 3 is the constant voltage signal, and the capacitor C1 has a holding effect on voltages at both terminals thereof, a voltage at the node A in the first thin film transistor T1 may be kept relatively stable with respect to voltages at two terminals of the first thin film transistor T1. Therefore, it is beneficial to reduce a risk of leakage current.

It will be noted that, a shape and position of the capacitor C1 may be determined according to actual design requirements, and mainly depend on distribution of the first active layer 11, the conductive layer 3 and the second gate 12. The position of the capacitor C1 should avoid excessive overlapping with metal layer(s) where signal(s) jump as much as possible.

Optionally, as shown in FIG. 6, the first semiconductor portion 111 extends in a second direction Y, and the second semiconductor portion 112 extends in a first direction X. The first direction X intersects the second direction Y.

An angle between the first direction X and the second direction Y may be selectively set according to actual needs. For example, the first direction X and the second direction Y are perpendicular to each other.

For example, the conductor portion 113 extends in the second direction Y.

In this case, an extending direction of the conductor portion 113 and an extending direction of the first semiconductor portion 111 are the same. The extending direction of the conductor portion 113 and an extending direction of the second semiconductor portion 112 are perpendicular to each other, so that the conductor portion 113 and the second semiconductor portion 112 form a corner structure.

For another example, a central portion (i.e., the conductor portion 113) of the first active layer 11 extends in the first direction X.

In this case, the extending direction of the conductor portion 113 and the extending direction of the second semiconductor portion 112 are the same. The extending direction of the conductor portion 113 and the extending direction of the first semiconductor portion 111 are perpendicular to each other, so that the conductor portion 113 and the first semiconductor portion 111 form a corner structure.

Figure 4:
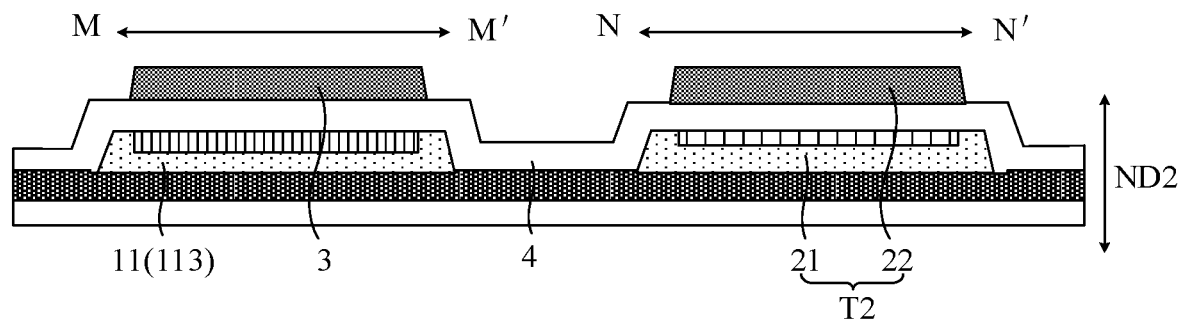
FIG. 4 is a sectional view of a pixel driving circuit in the display panel shown in FIG. 3 taken along the M-M' line and the N-N' line.

In some examples, as shown in FIGS. 3 and 4, the second thin film transistor T2 includes a second active layer 21 and a first gate 22 disposed on a side of the second active layer 21 in a thickness direction TD2 of the second active layer 21. A portion of the second active layer 21 that is directly opposite to the first gate 22 has a second doping concentration. The second doping concentration is lower than the first doping concentration.

For example, the first doping concentration may be in a range of $10^{14}$ ions/cm$^2$ to $10^{16}$ ions/cm$^2$, inclusive, and the second doping concentration may be approximately $10^{12}$ ions/cm$^2$.

Here, the second active layer 21 is at least partially directly opposite to the first gate 22. That is, a portion of the second active layer 21 is directly opposite to a portion of the first gate 22, or a portion of the second active layer 21 is directly opposite to the first gate 22, or the second active layer 21 is directly opposite to a portion of the first gate 22, or the second active layer 21 is directly opposite to the first gate 22.

For example, as shown in FIGS. 3 and 5, the first gate 22 is electrically connected to an enable signal terminal EM.

For example, in a case where an enable signal transmitted by the enable signal terminal EM is at a high level, the second thin film transistor T2 may be turned on under control of the enable signal, and perform corresponding signal transmission.

By doping the portion of the second active layer 21 that is directly opposite to the first gate 22, and making the second doping concentration lower than the first doping concentration, not only may transistor properties of the second thin film transistor T2 be ensured, but also a threshold voltage of the second thin film transistor T2 may be adjusted. As a result, in the case where the enable signal is at the high level, a resistance to drift of the threshold voltage is enhanced.

Therefore, in the pixel driving circuit 100 provided by some embodiments of the present disclosure, the central portion of the first active layer 11 in the first thin film transistor T1 is doped with a concentration different from that of the second active layer 21 of the second thin film transistor T2, so that the doped central portion of the first active layer 11 form the conductor portion 113. That is, the first doping concentration of the conductor portion 113 in the first active layer 11 is greater than the second doping concentration of the second active layer 21. Moreover, since the conductive layer 3 is disposed on the side of the conductor portion 113, the conductive layer 3 and the conductor portion 113 at least partially directly opposite to each other, and the conductive layer 3 is electrically connected to the initial voltage terminal Vint, not only may the conductor portion 113 and the conductive layer 3 form the capacitor C1, but also the conductor portion 113 may be ensured to maintain a stable voltage. As a result, it is possible to keep the voltage at the node A in the first thin film transistor T1 relatively stable with respect to the voltages at the two terminals of the first thin film transistor T1 by a holding effect of the capacitor C1 on a potential, thereby significantly reducing the risk of generating a leakage current and ensuring a high reliability of the pixel driving circuit 100 in operation.

In addition, under a premise that the doping concentration of the conductor portion 113 in the first active layer 11 of the first thin film transistor T1 is not affected, a value of the second doping concentration of the second active layer 21 of the second thin film transistor T2 may be adjusted appropriately, so that in the case where the enable signal is at the high level, an amount of leakage current of the second thin film transistor T2 is effectively reduced, an ability to resist the drift of the threshold voltage is improved, and the reliability during operation is further improved.

In some embodiments, as shown in FIGS. 3, 4, 6 and 7, the first active layer 11 and the second active layer 21 are disposed in a same layer. The conductive layer 3, the first gate 22, and the second gate 12 are disposed in a same layer.

It will be noted that the "same layer" mentioned herein refers to a layer structure with specific patterns formed by performing a patterning process on a film by using a same mask after the film is formed by using a same film-forming process. Depending on different specific patterns, the patterning process may include multiple exposure, development and etching processes, and the specific patterns in the formed layer structure may be continuous or discontinuous, and these specific patterns may also be at different heights or have different thicknesses. In this way, the first active layer 11 and the second active layer 21 may be formed simultaneously in one patterning process, and the conductive layer 3, the first gate 22, and the second gate 12 may be formed simultaneously in one patterning process, which is beneficial to simplify manufacturing processes of the pixel driving circuit 100.

For example, FIG. 4 shows a structure of the second thin film transistor T2 and a structure of the first thin film transistor T1; the second gate 12 of the first thin film transistor T1 is not shown in FIG. 4, and FIG. 4 only shows the conductor portion 113 in the first active layer 11 that is directly opposite to the second gate 12. FIG. 7 shows the first semiconductor portion 111 in the first active layer 11 that is directly opposite to the first sub-gate 121 and the second semiconductor portion 112 in the first active layer 11 that is directly opposite to the second sub-gate 122. As shown in FIGS. 4 and 7, the first active layer 11 and the second active layer 21 are in the same layer, and may be manufactured by using the same mask; and the first gate 22, the second gate 12, and the conductive layer 3 are in the same layer, and may be manufactured by using the same mask.

In some embodiments, the pixel driving circuit 100 further includes an interlayer dielectric layer. As shown in FIGS. 4 and 7, the interlayer dielectric layer 4 is located between the first active layer 11 and the conductive layer 3, and between the second active layer 21 and the first gate 22. That is, the conductive layer 3 and the first gate 22 are both disposed on the interlayer dielectric layer 4.

Here, by providing the interlayer dielectric layer 4, the first active layer 11 and the conductive layer 3 may be electrically insulated by the interlayer dielectric layer 4, which prevents the first active layer 11 and the conductive layer 3 from being short-circuited, and the second active layer 21 and the first gate 22 may be electrically insulated by the interlayer dielectric layer 4, which prevents the second active layer 21 and the first gate 22 from being short-circuited.

In some examples, a thickness of a portion of the interlayer dielectric layer 4 located between the first active layer 11 and the conductive layer 3 is in a range of 1100 angstroms to 1300 angstroms, inclusive.

Optionally, the thickness of the portion of the interlayer dielectric layer 4 located between the first active layer 11 and the conductive layer 3 may be 1100 angstroms, 1150 angstroms, 1200 angstroms, 1250 angstroms, 1300 angstroms or the like.

In the related art, a capacitor and the double-gate thin film transistor in the pixel driving circuit are two independent structures, and an insulating layer is provided between two electrode plates of the capacitor, and a distance between the two electrode plates (i.e., a thickness of the insulating layer) is relatively large (e.g., 1400 angstroms).

In the examples of the present disclosure, the thickness of the portion of the interlayer dielectric layer 4 located between the first active layer 11 and the conductive layer 3 is relatively small, so that a distance between the first active layer 11 and the conductive layer 3 is relatively small. As a result, a capacitance value of the capacitor C1 in the embodiments of the present disclosure is large under a condition that areas of the capacitor in the related art and the capacitor C1 in the embodiments of the present disclosure are equal.

For example, a calculation formula of the capacitance value c of the capacitor C1 is: $c = \varepsilon S / 4\pi k d$. $\varepsilon$ represents a dielectric constant, S represents the area of the capacitor C1, K represents an electric force constant, and d represents the distance between the first active layer 11 and the conductive layer 3 (i.e., the thickness of the portion of the interlayer dielectric layer 4 located between the first active layer 11 and the conductive layer 3).

In the embodiments of the present disclosure, it is obtained experimentally that, in a case where the area of the capacitor C1 is 140 $\mu m^2$ and d is 1200 angstroms, the capacitance value of the capacitor C1 is 16% higher than a capacitance value of the capacitor in the related art. It can be seen that the capacitor C1 in the embodiments of the present disclosure may have a larger capacitance value.

In some embodiments, as shown in FIGS. 2 and 3, the pixel driving circuit 100 further includes a third thin film transistor T3, a fourth thin film transistor T4, a fifth thin film transistor T5, a sixth thin film transistor T6, a seventh thin film transistor T7, an eighth thin film transistor T8, a ninth thin film transistor T9, and a storage capacitor Cst.

A structure of the pixel driving circuit 100 will be schematically described below with reference to the accompanying drawings.

In some examples, as shown in FIG. 2, the second gate 12 of the first thin film transistor T1 is electrically connected to a scan signal terminal Gate, a first electrode of the first thin film transistor T1 is electrically connected to a first node N1, and a second electrode of the first thin film transistor T1 is electrically connected to a second node N2.

For example, in a case where a scan signal transmitted by the scan signal terminal Gate is at a high level, the first thin film transistor T1 may be turned on under control of the scan signal, and transmit an electrical signal from the first node N1 to the second node N2.

Here, the first thin film transistor T1 may be referred to as a compensation transistor.

In some examples, as shown in FIG. 2, the first gate 21 of the second thin film transistor T2 is electrically connected to the enable signal terminal EM, a first electrode of the second thin film transistor T2 is electrically connected to the second node N2, and a second electrode of the second thin film transistor T2 is electrically connected to a third node N3.

For example, in the case where the enable signal transmitted by the enable signal terminal EM is at the high level, the second thin film transistor T2 may be turned on under the control of the enable signal, and transmit an electrical signal from the second node N2 to the third node N3.

Here, the second thin film transistor T2 may be referred to as a light emission control transistor.

In some examples, as shown in FIG. 2, a gate of the third thin film transistor T3 is electrically connected to the first node N1, a first electrode of the third thin film transistor T3 is electrically connected to a first voltage signal terminal ELVDD, and a second electrode of the third thin film transistor T3 is electrically connected to the second node N2.

For example, in a case where a voltage of the first node N1 is a high voltage, the third thin film transistor T3 may be turned on under control of the voltage of the first node N1, and transmit a first voltage signal from the first voltage signal terminal ELVDD to the second node N2.

In some examples, as shown in FIG. 2, a gate of the fourth thin film transistor T4 is electrically connected to the scan signal terminal Gate, a first electrode of the fourth thin film transistor T4 is electrically connected to a data signal terminal Data, and a second electrode of the fourth thin film transistor T4 is electrically connected to a fourth node N4.

For example, in the case where the scan signal transmitted by the scan signal terminal Gate is at the high level, the fourth thin film transistor T4 may be turned on under control of the scan signal, and transmit a data signal from the data signal terminal Data to the fourth node N4.

In some examples, as shown in FIG. 2, a gate of the fifth thin film transistor T5 is electrically connected to the enable signal terminal EM, and a first electrode of the fifth thin film transistor T5 is electrically connected to the first node N1.

In some examples, as shown in FIG. 2, a gate of the sixth thin film transistor T6 is electrically connected to a reset signal terminal Reset, a first electrode of the sixth thin film transistor T6 is electrically connected to the initial voltage terminal Vint, and a second electrode of the sixth thin film transistor T6 is electrically connected to the first node N1.

For example, in a case where a reset signal transmitted by the reset signal terminal Reset is at a high level, the sixth thin film transistor T6 may be turned on under control of the reset signal, and transmit an initial voltage signal from the initial voltage terminal Vint to the first node N1 to reset the first node N1.

In some examples, as shown in FIG. 2, a gate of the seventh thin film transistor T7 is electrically connected to the reset signal terminal Reset, a first electrode of the seventh thin film transistor T7 is electrically connected to the initial voltage terminal Vint, and a second electrode of the seventh thin film transistor T7 is electrically connected to the third node N3.

For example, in a case where the reset signal transmitted by the reset signal terminal Reset is at the high level, the seventh thin film transistor T7 may be turned on under the control of the reset signal, and transmit the initial voltage signal from the initial voltage terminal Vint to the third node N3 to reset the third node N3.

In some examples, as shown in FIG. 2, a gate of the eighth thin film transistor T8 is electrically connected to the enable signal terminal EM, a first electrode of the eighth thin film transistor T8 is electrically connected to a reference voltage terminal Vref, and a second electrode of the eighth thin film transistor T8 is electrically connected to the fourth node N4.

For example, in a case where the enable signal transmitted by the enable signal terminal EM is at the high level, the eighth thin film transistor T8 may be turned on under the control of the enable signal, and transmit a reference voltage from the reference voltage terminal Vref to the fourth node N4 to reset the fourth node N4.

In some examples, as shown in FIG. 2, a gate of the ninth thin film transistor T9 is electrically connected to the reset signal terminal Reset, a first electrode of the ninth thin film transistor T9 is electrically connected to the reference voltage terminal Vref, and a second electrode of the ninth thin film transistor T9 is electrically connected to the fourth node N4.

For example, in a case where the reset signal transmitted by the reset signal terminal Reset is at the high level, the ninth thin film transistor T9 may be turned on under the control of the reset signal, and transmit the reference voltage from the reference voltage terminal Vref to the fourth node N4 to reset the fourth node N4.

In some examples, as shown in FIG. 2, a first electrode plate of the storage capacitor Cst is electrically connected to the fourth node N4, and a second electrode plate of the storage capacitor Cst is electrically connected to the first node N1.

For example, the storage capacitor Cst is charged during a process in which the fourth thin film transistor T4 is turned on to transmit the data signal to the fourth node N4.

It will be noted that FIG. 3 shows a layout in one form of the pixel driving circuit 100, and the pixel driving circuit 100 may also have a layout in other form without departing from an invention concepts of the present disclosure.

Figure 8:
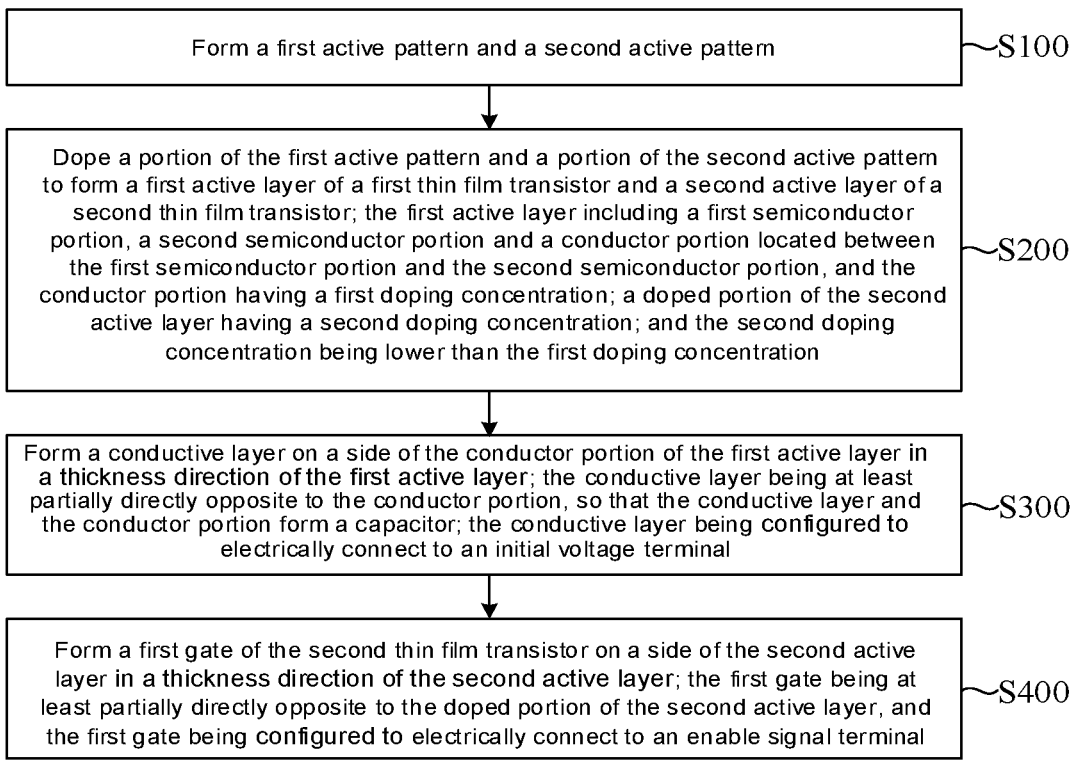
FIG. 8 is a flow diagram of a manufacturing method of a pixel driving circuit, in accordance with some embodiments of the present disclosure.

Some embodiments of the present disclosure provide a manufacturing method of a pixel driving circuit, and the manufacturing method is used to manufacture the pixel driving circuit 100 provided by the above embodiments of the present disclosure. A schematic flow diagram of the manufacturing method is as shown in FIG. 8. The manufacturing method includes steps 100 to 400 (S100 to S400).

Figure 11A:
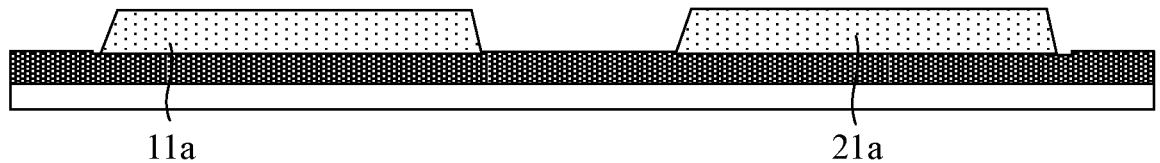
FIGS. 11a to 11e are step diagrams of a manufacturing method of a pixel driving circuit, in accordance with some embodiments of the present disclosure.

In S100, as shown in FIG. 11a, a first active pattern 11a and a second active pattern 21a are formed.

For example, materials of the first active pattern 11a and the second active pattern 21a are both polysilicon (P-Si).

In some examples of the present disclosure, S100 may include: forming a polysilicon film, doping a plurality of regions of the polysilicon film with P-type carriers to form an initial silicon film, and patterning the initial silicon film to form a plurality of patterns. The plurality of patterns include the first active pattern 11a and the second active pattern 21a. In a case where the pixel driving circuit 100 further includes other thin film transistors, the plurality of patterns further include active patterns corresponding to the other thin film transistors.

Those skilled in the art can understand that patterning the initial silicon film includes at least coating photoresist on the initial silicon film, exposing and developing the photoresist, etching the initial silicon film, cleaning the photoresist, etc., which will not be repeated here.

Figure 11B:
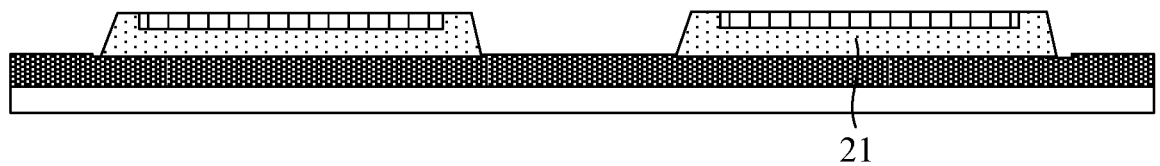
Figure 11C:
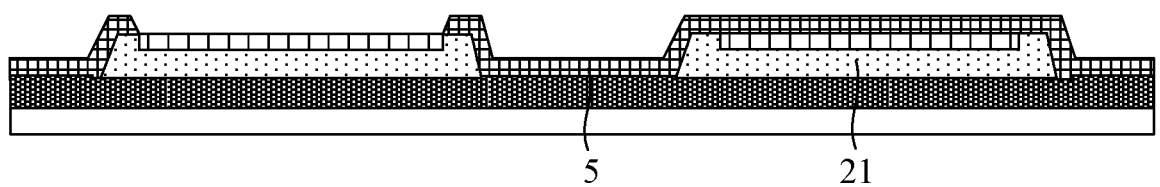
Figure 11D:
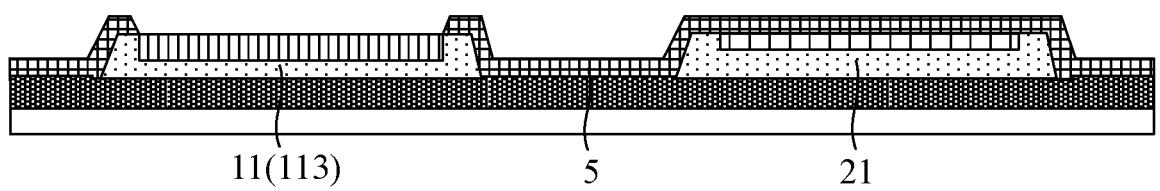

In S200, as shown in FIG. 11d, a portion of the first active pattern 11a and a portion of the second active pattern 21a are doped, so as to form the first active layer 11 of the first thin film transistor T1 and the second active layer 21 of the second thin film transistor T2. The first active layer 11 of the first thin film transistor T1 includes the first semiconductor portion 111, the second semiconductor portion 112, and the conductor portion 113 located between the first semiconductor portion 111 and the second semiconductor portion 112. The conductor portion 113 has the first doping concentration. A doped portion of the second active layer 21 of the second thin film transistor T2 has the second doping concentration. The second doping concentration is lower than the first doping concentration.

Here, "a portion of the first active pattern 11a" refers to a portion of the first active pattern 11a located between the first semiconductor portion 111 and the second semiconductor portion 112, and the portion is at least partially directly opposite to a conductive layer 3 formed subsequently. "A portion of the second active pattern 21a" refers to a portion of the second active pattern 21a that is at least partially directly opposite to a first gate 21 formed subsequently.

By doping the portion of the first active pattern 11a and making the portion have the first doping concentration, the portion may be made to form a conductor (i.e., the conductor portion 113) and form the capacitor with the conductive layer 3 formed subsequently. By doping the portion of the second active pattern 21a and making the portion have the second doping concentration, a threshold voltage of the second thin film transistor T2 may be reduced.

Figure 11E:
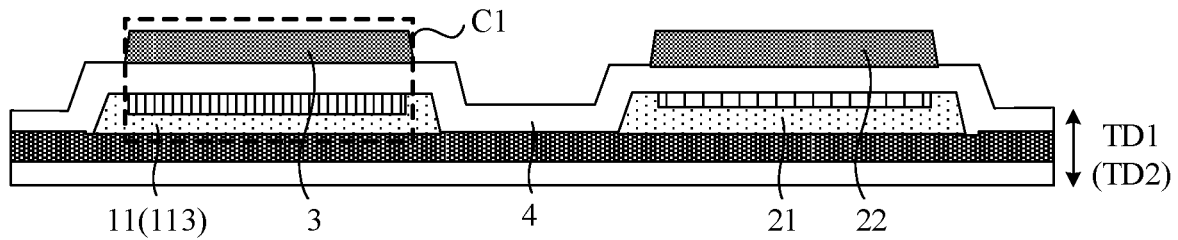

In S300, as shown in FIG. 11e, the conductive layer 3 is formed on a side of the conductor portion 113 of the first active layer 11 in a thickness direction TD1 of the first active layer 11. The conductive layer 3 is at least partially directly opposite to the conductor portion 113, so that the conductive layer 3 and the conductor portion 113 form the capacitor C1. The conductive layer 3 is configured to electrically connect to the initial voltage terminal Vint.

In S400, as shown in FIG. 11e, the first gate 22 of the second thin film transistor T2 is formed on a side of the second active layer 21 in a thickness direction TD2 of the second active layer 21. The first gate 22 is at least partially directly opposite to the doped portion of the second active layer 21, and the first gate 21 is configured to electrically connect to the enable signal terminal EM.

In some examples, the conductive layer 3 and the first gate 22 are disposed in the same layer, and thus the above S300 and S400 may be performed simultaneously. That is, the conductive layer 3 and the first gate 22 may be formed in the same patterning process.

For example, a method for forming the conductive layer 3 and the first gate 22 includes: forming a metal film (e.g., using a sputtering process), and patterning the metal film (e.g., using a photolithography process) to form the conductive layer 3 and the first gate 22.

Here, in a process of forming the conductive layer 3 and the first gate 22, a second gate 12 of the first thin film transistor T1 may also be formed simultaneously. The second gate 12 includes a first sub-gate 121 at least partially directly opposite to the first semiconductor portion 111 and a second sub-gate 122 at least partially directly opposite to the second semiconductor portion 112.

Those skilled in the art can understand that the conductive layer 3 in the capacitor C1 is at least partially directly opposite to the conductor portion 113 having the first doping concentration in the first active layer 11, and gates of thin film transistors are at least partially directly opposite to channel regions in respective active layers.

The manufacturing method of the pixel driving circuit provided by some embodiments of the present disclosure has the same inventive concepts and beneficial effects as the pixel driving circuit 100 in the above-mentioned embodiments, which will not be repeated here.

In some embodiments, the manufacturing method of the pixel driving circuit further includes forming an interlayer dielectric layer 4 on sides of the first active layer 11 and the second active layer 21 before forming the conductive layer 3 and the first gate 22.

For example, the interlayer dielectric layer 4 may be formed by using a coating process or a deposition process. The process for forming the interlayer dielectric layer 4 is related to a material of the interlayer dielectric layer 4.

Figure 9:
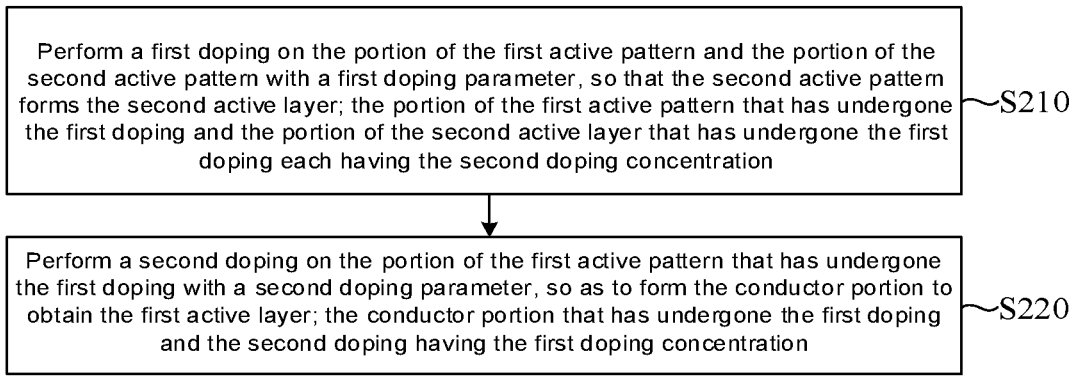
FIG. 9 is a flow diagram of step 200 (S200) in the flow diagram shown in FIG. 8.

In some embodiments, as shown in FIG. 9, doping the portion of the first active pattern 11a and the portion of the second active pattern 21a to form the first active layer 11 of the first thin film transistor T1 and the second active layer 21 of the second thin film transistor T2 in the above S200 includes steps 210 and 220 (S210 and S220).

In S210, as shown in FIG. 11b, a first doping is performed on the portion of the first active pattern 11a and the portion of the second active pattern 21a with a first doping parameter, so that the second active pattern 21a forms the second active layer 21. The portion of the first active pattern 11a that has undergone the first doping and the portion of the second active layer 21 that has undergone the first doping each have the second doping concentration.

Figure 13:
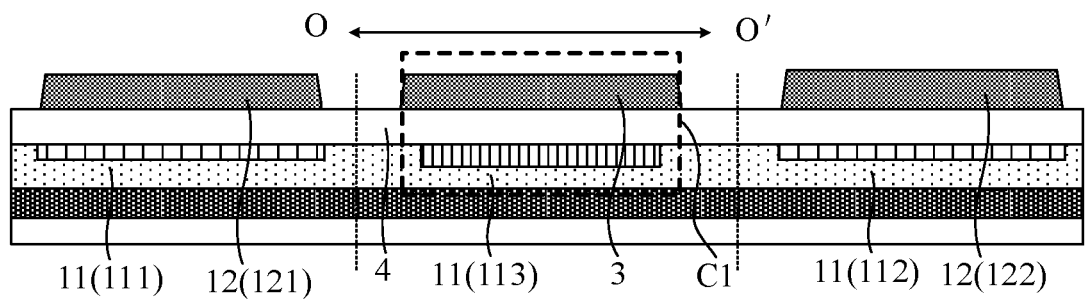
FIG. 13 is another sectional view of a structure shown in FIG. 6 taken along the O-O' direction.

Here, after S210 is performed, a structure shown in FIG. 11b is formed, and all the portions that have undergone the first doping have the second doping concentration. Optionally, as shown in FIG. 13, a portion of the first semiconductor portion 111 in the first active layer 11 that is directly opposite to the first sub-gate 121 of the second gate 12 has the second doping concentration; and a portion of the second semiconductor portion 112 in the first active layer 11 that is directly opposite to the second sub-gate 122 of the second gate 12 has the second doping concentration.

The first doping parameter may be determined according to actual design requirements, which shall at least enable the formed second thin film transistor T2 to have an effect of effectively reducing an amount of leakage current of the second thin film transistor T2 to improve an ability to resist the drift of the threshold voltage in a case where the enable signal is at the high level.

For example, the first doping parameter may be $10^{12}$ ions/cm$^2$, and under this doping condition, the threshold voltage of the second thin film transistor T2 may be reduced to −3 V to −2 V, inclusive.

In S220, as shown in FIG. 11d, a second doping is performed on the portion of the first active pattern 11a that has undergone the first doping with a second doping parameter, so as to form the conductor portion 113 to obtain the first active layer 11. The conductor portion 113 that has undergone the first doping and the second doping has the first doping concentration.

After S220 is performed, only the conductor portion 113 has the first doping concentration, and other active layers are not doped in S220. Therefore, portions of the other active layers that have undergone the first doping still only have the second doping concentration, thereby achieving that the portion, corresponding to the node A in the equivalent circuit shown in FIG. 5, of the first active layer 11 in the first thin film transistor T1 and the second active layer 21 of the second thin film transistor T2 have different doping concentration.

The second doping parameter may be determined according to actual design requirements, which shall at least enable the formed capacitor C1 to have a sufficiently high capacitance value, so that the voltage of the portion, corresponding to the node A, of the first thin film transistor T1 is relatively stable with respect to voltages at the two terminals of the first thin film transistor T1, so as to achieve an effect of reducing the risk of generating a leakage current.

For example, after the second doping is performed, the first doping concentration of the conductor portion 113 is a sum of the first doping parameter and the second doping parameter. The first doping concentration may be $10^{14}$ ions/cm$^2$ to $10^{16}$ ions/cm$^2$, inclusive.

Figure 10:
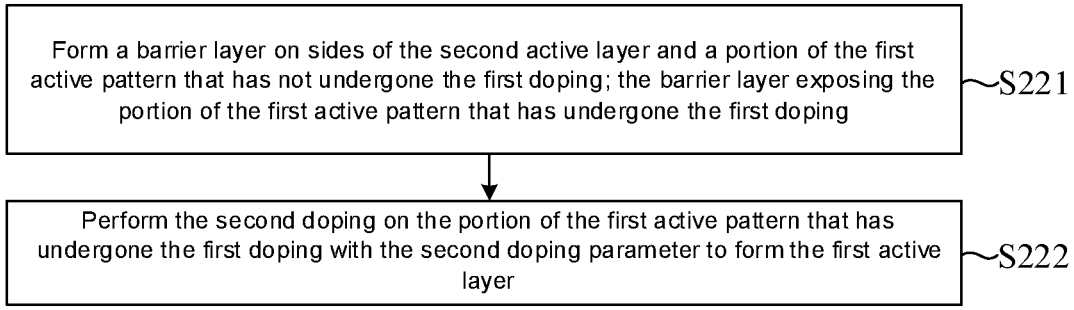
FIG. 10 is a flow diagram of step 220 (S220) in the flow diagram shown in FIG. 9.

In some examples, as shown in FIG. 10, performing the second doping on the portion of the first active pattern 11a that has undergone the first doping with the second doping parameter, so as to form the conductor portion 113 to obtain the first active layer 11 in the above S220 includes steps 221 and 222 (S221 and S222).

In S221, as shown in FIG. 11c, a barrier layer 5 is formed on sides of the second active layer 21 and a portion of the first active pattern 11a that has not undergone the first doping. The barrier layer 5 exposes the portion of the first active pattern 11a that has undergone the first doping.

After S221 is performed, as shown in FIG. 11c, only the portion of the first active layer to be formed located between the first semiconductor portion 111 and the second semiconductor portion 112 is not covered by the barrier layer 5, whereas the second active layer 21 and all the other active layers (not shown in FIG. 11c) are covered by the barrier layer 5, which may ensure that the second doping is performed only on the portion of the first active pattern 11a that has undergone the first doping.

For example, the barrier layer 5 may be an organic layer. That is, a material of the barrier layer 5 may be an organic material.

In S222, as shown in FIG. 11d, the second doping is performed on the portion of the first active pattern 11a that has undergone the first doping with the second doping parameter to form the first active layer 11.

After S222 is performed, the portion of the first active pattern 11a that has undergone the first doping and the second doping sequentially has the second doping concentration, thereby forming the first active layer 11.

It will be noted that, after S222 is performed, the barrier layer 5 is removed, and then the interlayer dielectric layer 4 is formed on the first active layer 11 and the second active layer 12.

Some embodiments of the present disclosure provide a display panel 200. As shown in FIG. 3, the display panel 200 includes a plurality of pixel driving circuits 100 each as described in any of the above embodiments.

In some examples, as shown in FIG. 3, the display panel 200 further includes a substrate 6. The substrate 6 is, for example, a flexible substrate. Alternatively, the to substrate 6 may be a rigid substrate (e.g. a glass substrate).

In some examples, as shown in FIG. 3, the display panel 200 further includes a plurality of initial voltage signal lines VL and a plurality of enable signal lines EL disposed on a side of the substrate 6. The plurality of initial voltage signal lines VL extend in a second direction Y, and the plurality of enable signal lines EL extend in a first direction X.

For example, as shown in FIG. 3, the plurality of initial voltage signal lines VL may be disposed in the same layer as data signal lines DL. A data signal line DL is electrically connected to a data signal terminal Data, and is used to transmit a data signal to the data signal terminal Data. In this way, it is beneficial to simplify manufacturing processes of the display panel 200.

For example, as shown in FIG. 3, the plurality of enable signal lines EL may be disposed in the same layer as the conductive layer 3, the second gate 12 of the first thin film transistor T1, and the first gate 22 of the second thin film transistor T2. In this way, it is beneficial to simplify the manufacturing processes of the display panel 200.

In some examples, as shown in FIG. 3, the plurality of pixel driving circuits 100 may be disposed on the side of the substrate 6. A conductive layer 3 of a pixel driving circuit 100 may be electrically connected to an initial voltage signal line VL through an initial voltage terminal Vinit, and the initial voltage signal line VL may transmit an initial voltage signal to the initial voltage terminal Vinit, and in turn the initial voltage signal is transmitted to the conductive layer 3. A first gate 22 of a second thin film transistor T2 of a pixel driving circuit 100 is electrically connected to an enable signal line EL through an enable signal terminal EM, and the enable signal line EL may transmit an enable signal to the enable signal terminal EM, and in turn the enable signal is transmitted to the first gate 22 of the second thin film transistor T2.

The display panel 200 provided by some embodiments of the present disclosure has the same inventive concepts and beneficial effects as the pixel driving circuit 100 in the above-mentioned embodiments, which will not be repeated here.

In some examples, as shown in FIG. 3, the display panel 200 further includes a plurality of scan signal lines GL disposed on a side of the substrate 6 and extending in the first direction X. A second gate 12 of a first thin film transistor T1 of a pixel driving circuit 100 is electrically connected to a scan signal line GL through a scan signal terminal Gate.

The scan signal line GL may transmit a scan signal to the scan signal terminal Gate, and in turn the scan signal is transmitted to the second gate 12 of the first thin film transistor T1, so as to control an on or off state of the first thin film transistor T1.

In some examples, as shown in FIG. 2, the display panel 200 further includes a plurality of light-emitting devices 7 disposed on the side of the substrate 6. The second electrode of the second thin film transistor T2 is electrically connected to an anode of a light-emitting device 7. A cathode of the light-emitting device 7 is electrically connected to a second voltage signal terminal ELVSS.

The pixel driving circuit 100 may transmit a driving voltage to the third node N3 through the second thin film transistor T2. The light-emitting device 7 may emit light due to cooperation of the driving voltage at the third node N3 and a second voltage signal transmitted by the second voltage signal terminal ELVSS.

In some embodiments, the display panel 200 further includes a buffer layer and an organic layer that are stacked on the substrate 6. The first thin film transistor T1 and the second thin film transistor T2 are disposed on the organic layer and separated from the base 6 by the organic layer and the buffer layer.

Figure 12:
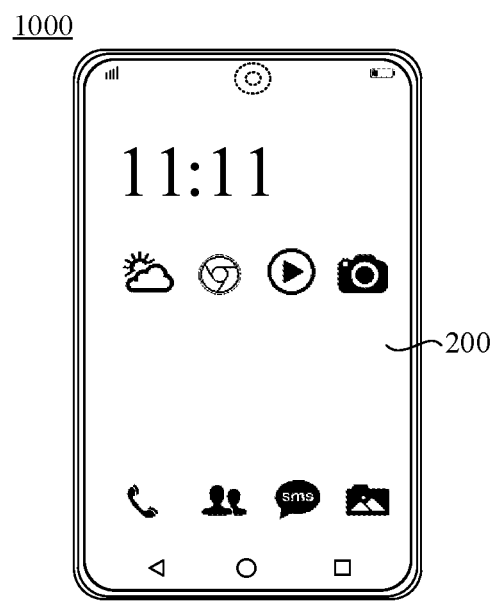
FIG. 12 is a structural diagram of a display apparatus, in accordance with some embodiments of the present disclosure.

Some embodiments of the present disclosure provide a display apparatus 1000. As shown in FIG. 12, the display apparatus 1000 includes the display panel 200 provided in some of the above embodiments.

The beneficial effects that can be achieved by the display apparatus 1000 provided in some embodiments of the present disclosure are the same as the beneficial effects that can be achieved by the display panel 200 provided in some of the above embodiments, and will not be repeated here.

In some embodiments, the display apparatus 1000 may be any product or component with a display function, such as a mobile phone, a tablet computer, a television, a display, a notebook computer, a digital photo frame, and a navigator.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A pixel driving circuit, comprising:
a first thin film transistor having a double-gate structure, the first thin film transistor including a first active layer, wherein the first active layer includes a first semiconductor portion, a second semiconductor portion, and a conductor portion located between the first semiconductor portion and the second semiconductor portion, and the conductor portion has a first doping concentration;
a conductive layer disposed on a side of the first active layer in a thickness direction of the first active layer, wherein the conductive layer is at least partially directly opposite to the conductor portion, so that the conductive layer and the conductor portion form a capacitor; the conductive layer is configured to electrically connected to an initial voltage terminal; and
a second thin film transistor electrically connected to the first thin film transistor, the second thin film transistor including a second active layer and a first gate disposed on a side of the second active layer in a thickness direction of the second active layer, wherein a portion of the second active layer that is directly opposite to the first gate has a second doping concentration, and the second doping concentration is lower than the first doping concentration; the first gate is configured to electrically connect to an enable signal terminal; wherein the first thin film transistor further includes a second gate disposed on the side of the first active layer in the thickness direction of the first active layer, the second gate includes a first sub-gate and a second sub-gate; the first sub-gate is at least partially directly opposite to the first semiconductor portion, and the second sub-gate is at least partially directly opposite to the second semiconductor portion; wherein the first active layer and the second active layer are disposed in a same layer; and the conductive layer, the first gate, and the second gate are disposed in a same layer.

2. The pixel driving circuit according to claim 1, wherein the first semiconductor portion extends in a second direction, the second semiconductor portion extends in a first direction, the first direction intersects the second direction; and the conductor portion connects the first semiconductor portion and the second semiconductor portion and extends in the first direction.

3. The pixel driving circuit according to claim 1, wherein the first semiconductor portion extends in a second direction, the second semiconductor portion extends in a first direction, the first direction intersects the second direction;
the conductor portion connects the first semiconductor portion and the second semiconductor portion and extends in the second direction.

4. The pixel driving circuit according to claim 1, further comprising an interlayer dielectric layer, wherein
the interlayer dielectric layer is located between the first active layer and the conductive layer, and between the second active layer and the first gate.

5. The pixel driving circuit according to claim 4, wherein a thickness of a portion of the interlayer dielectric layer located between the first active layer and the conductive layer is in a range of 1100 angstroms to 1300 angstroms, inclusive.

6. The pixel driving circuit according to claim 1, wherein the second gate is configured to electrically connect to a scan signal terminal, a first electrode of the first thin film transistor is electrically connected to a first node, and a second electrode of the first thin film transistor is electrically connected to a second node; and
a first electrode of the second thin film transistor is electrically connected to the second node, and a second electrode of the second thin film transistor is electrically connected to a third node;
the pixel driving circuit further comprises: a third thin film transistor, a fourth thin film transistor, a fifth thin film transistor, a sixth thin film transistor, a seventh thin film transistor, an eighth thin film transistor, a ninth thin film transistor and a storage capacitor, wherein
a gate of the third thin film transistor is electrically connected to the first node, a first electrode of the third thin film transistor is electrically connected to a first voltage signal terminal, and a second electrode of the third thin film transistor is electrically connected to the second node;
a gate of the fourth thin film transistor is electrically connected to the scan signal terminal, a first electrode of the fourth thin film transistor is electrically connected to a data signal terminal, and a second electrode of the fourth thin film transistor is electrically connected to a fourth node;
a gate of the fifth thin film transistor is electrically connected to the enable signal terminal, and a first electrode of the fifth thin film transistor is electrically connected to the first node;
a gate of the sixth thin film transistor is electrically connected to a reset signal terminal, a first electrode of the sixth thin film transistor is electrically connected to the initial voltage terminal, and a second electrode of the sixth thin film transistor is electrically connected to the first node;
a gate of the seventh thin film transistor is electrically connected to the reset signal terminal, a first electrode of the seventh thin film transistor is electrically connected to the initial voltage terminal, and a second electrode of the seventh thin film transistor is electrically connected to the third node;
a gate of the eighth thin film transistor is electrically connected to the enable signal terminal, a first electrode of the eighth thin film transistor is electrically connected to a reference voltage terminal, and a second electrode of the eighth thin film transistor is electrically connected to the fourth node;
a gate of the ninth thin film transistor is electrically connected to the reset signal terminal, a first electrode of the ninth thin film transistor is electrically connected to the reference voltage terminal, and a second electrode of the ninth thin film transistor is electrically connected to the fourth node; and
a first electrode plate of the storage capacitor is electrically connected to the fourth node, and a second electrode plate of the storage capacitor is electrically connected to the first node.

7. A display panel, comprising:
a substrate;
a plurality of initial voltage signal lines and a plurality of enable signal lines that are disposed on a side of the substrate, the plurality of initial voltage signal lines extending in a second direction, the plurality of enable signal lines extending in a first direction; and
a plurality of pixel driving circuits each according to claim 1; a conductive layer of a pixel driving circuit being electrically connected to an initial voltage signal line through the initial voltage terminal, and a first gate of a second thin film transistor of the pixel driving circuit being electrically connected to an enable signal line through the enable signal terminal.

8. The display panel according to claim 7, further comprising a plurality of scan signal lines disposed on the side of the substrate and extending in the first direction, wherein
a second gate of a first thin film transistor of the pixel driving circuit is electrically connected to a scan signal line.

9. The display panel according to claim 7, further comprising a plurality of light-emitting devices disposed on the side of the substrate, wherein
a second electrode of the second thin film transistor is electrically connected to an anode of a light-emitting device; and
a cathode of the light-emitting device is electrically connected to a second voltage signal terminal.

10. A display apparatus, comprising the display panel according to claim 7.

11. The pixel driving circuit according to claim 1, wherein the first semiconductor portion, the conductor portion and the second semiconductor portion are sequentially connected to form an integral structure.

12. The pixel driving circuit according to claim 1, wherein a portion of the first semiconductor portion that is directly opposite to the first sub-gate has the second doping concentration, and a portion of the second semiconductor portion that is directly opposite to the second sub-gate has the second doping concentration.

13. A manufacturing method of a pixel driving circuit, comprising:
forming a first active pattern and a second active pattern;
doping a portion of the first active pattern and a portion of the second active pattern to form a first active layer of a first thin film transistor and a second active layer of a second thin film transistor, wherein the first active layer includes a first semiconductor portion, a second semiconductor portion, and a conductor portion located between the first semiconductor portion and the second semiconductor portion, and the conductor portion has a first doping concentration; a doped portion of the second active layer has a second doping concentration, and the second doping concentration is lower than the first doping concentration;

forming a conductive layer on a side of the conductor portion of the first active layer in a thickness direction of the first active layer; the conductive layer being at least partially directly opposite to the conductor portion, so that the conductive layer and the conductor portion form a capacitor; the conductive layer being configured to electrically connect to an initial voltage terminal; and forming a first gate of the second thin film transistor on a side of the second active layer in a thickness direction of the second active layer, wherein the first gate is at least partially directly opposite to the doped portion of the second active layer, and the first gate is configured to electrically connect to an enable signal terminal; the manufacturing method further includes: forming a second gate of the first thin film transistor on a side of the first active layer in the thickness direction of the first activelayer, wherein the second gate includes a first sub-gate and a second sub-gate; and the first sub-gate is at least partially directly opposite to the first semiconductor portion, and the second sub-gate is at least partially directly opposite to the second semiconductor portion; wherein the first active layer and the second active layer are disposed in a same layer; and the conductive layer, the first gate, and the second gate are disposed in a same layer.

14. The manufacturing method according to claim 13, wherein doping the portion of the first active pattern and the portion of the second active pattern to form the first active layer of the first thin film transistor and the second active layer of the second thin film transistor, includes:

performing a first doping on the portion of the first active pattern and the portion of the second active pattern with a first doping parameter, so that the second active pattern forms the second active layer; and the portion of the first active pattern that has undergone the first doping and the portion of the second active layer that has undergone the first doping each having a second doping concentration; and performing a second doping on the portion of the first active pattern that has undergone the first doping with a second doping parameter, so as to form the conductor portion to obtain the first active layer; the conductor portion that has undergone the first doping and the second doping having the first doping concentration.

15. The manufacturing method according to claim 14, wherein performing the second doping on the portion of the first active pattern that has undergone the first doping with the second doping parameter, so as to form the conductor portion to obtain the first active layer, includes:

forming a barrier layer on sides of the second active layer and a portion of the first active pattern that has not undergone the first doping, the barrier layer exposing the portion of the first active pattern that has undergone the first doping; and performing the second doping on the portion of the first active pattern that has undergone the first doping with the second doping parameter to form the first active layer.

16. The manufacturing method according to claim 15, wherein after the second doping is performed on the portion of the first active pattern that has undergone the first doping with the second doping parameter, so as to form the conductor portion to obtain the first active layer, the method further comprises:

removing the barrier layer.

* * * * *